United States Patent [19]
Lee

[11] Patent Number: 6,075,703
[45] Date of Patent: Jun. 13, 2000

[54] HEAT SINK ASSEMBLY

[75] Inventor: Wan-Sub Lee, Suwon, Rep. of Korea

[73] Assignee: SamSung Electronics Co., Ltd., Suwon, Rep. of Korea

[21] Appl. No.: 09/048,326

[22] Filed: Mar. 26, 1998

[30]         Foreign Application Priority Data

Mar. 26, 1997 [KR] Rep. of Korea ............... 97-5822 U
Mar. 26, 1997 [KR] Rep. of Korea ............... 97-5823 U
Mar. 26, 1997 [KR] Rep. of Korea ............... 97-10514

[51] Int. Cl.$^7$ .................................................. H05K 7/20
[52] U.S. Cl. .................. 361/707; 174/16.3; 257/718; 361/710
[58] Field of Search .................................. 165/80.2, 185; 174/16.3; 257/718–719, 722, 726–727; 361/704, 707–710, 714, 715, 717–722, 829

[56]            References Cited

U.S. PATENT DOCUMENTS

| | | | |
|---|---|---|---|
| 3,519,889 | 7/1970 | Monaco | ................................. 361/707 |
| 4,344,106 | 8/1982 | West et al. | . |
| 4,602,315 | 7/1986 | Breese | ..................................... 361/709 |
| 4,716,498 | 12/1987 | Ellis | ........................................ 361/715 |
| 5,373,099 | 12/1994 | Boitard et al. | . |
| 5,381,041 | 1/1995 | Harmon | . |
| 5,436,798 | 7/1995 | Wieland, Jr. | . |
| 5,450,284 | 9/1995 | Wekell | . |
| 5,470,795 | 11/1995 | Shushurin | . |
| 5,500,556 | 3/1996 | Kosugi | . |
| 5,521,439 | 5/1996 | Casati et al. | . |
| 5,581,442 | 12/1996 | Morosas | . |
| 5,611,393 | 3/1997 | Vasconcelos et al. | . |
| 5,615,735 | 4/1997 | Yoshida et al. | . |
| 5,698,897 | 12/1997 | Nashimoto et al. | . |
| 5,844,312 | 12/1998 | Hinshaw et al. | ........................ 361/710 |

FOREIGN PATENT DOCUMENTS

| | | | |
|---|---|---|---|
| 5772011 | 12/1993 | European Pat. Off. | ............... 361/709 |
| 1069156 | 4/1986 | Japan | ..................................... 257/718 |
| 5191071 | 7/1993 | Japan | ..................................... 361/713 |
| 5288873 | 11/1993 | Japan | ..................................... 361/709 |
| 6177554 | 6/1994 | Japan | ..................................... 361/709 |
| 6310884 | 11/1994 | Japan | ..................................... 361/709 |

*Primary Examiner*—Gregory Thompson
*Attorney, Agent, or Firm*—Robert E. Bushnell, Esq.

[57]            ABSTRACT

A heat sink assembly adapted to mount on a printed circuit board for dissipating heat from a heat generating component of an electronic device. The heat sink assembly includes a base extended upwardly from the printed circuit board, and having a heat conducting surface for conducting heat, and a heat radiating surface opposite of said heat conducting surface for radiating heat from the heat conducting surface; at least one heat generating component positioned in contact with the heat conducting surface of the base; a fastening clip for clamping the heat generating component in contact with the heat conducting surface of the base; a plurality of cooling fins extended from the heat radiating surface of the base at predetermined intervals for dissipating the heat conducted through the heat conducting surface of the base and generated from the heat generating component; and support members extended at opposite ends of the base for protecting the heat generating component and supporting the mounting of said heat sink assembly on the printed circuit board.

18 Claims, 6 Drawing Sheets

HEAT SINK ASSEMBLY

CLAIM FOR PRIORITY

This application makes reference to, incorporates the same herein, and claims all benefits accruing under 35 U.S.C. §119 from an application for HEAT SINK earlier filed in the Korean Industrial Property Office on the Mar. $26^{th}$ 1997, and there duly assigned Ser. No. 97/10514, 97/5822 and 97/5823, a copy of which application is annexed hereto.

BACKGROUND OF THE INVENTION

Technical Field

The present invention relates to a heat sink assembly, and more specifically, relates to a heat sink assembly for electronic components such as transistors, integrated circuits or the like mounted on a printed circuit board (PCB) of electronic devices to efficiently dissipate heat from the electronic components.

Related Art

Electronic devices, such as monitors and power amplifiers, employ printed circuit boards on which the majority of electrical connections among different electrical or heat generating components, such as transistors and integrated circuits, are made. When electricity is passed through transistors and/or integrated circuits mounted on a printed circuit board (PCB), the transistors, particularly, power transistors and/or integrated circuits generate a substantial amount of heat. The heat must be drawn away from the transistors and/or integrated circuits and dissipated to maintain desirable low temperatures in the electronic device and to avoid damaging the transistors and/or integrated circuits. Conventional heat sink, which is a resilient metal element having a relatively large contact surface in contact with the transistors and/or integrated circuits and a relatively large radiating surface, is necessary to conduct the heat from the electrical components to the heat sink and the radiating surface for dissipation of heat. Most heat sinks are standardized and optimized in terms of shape and structure in order to minimize internal space requirements and air ventilation.

A typical heat sink assembly includes a base with a flat interface surface in contact with a heat generating component such as a transistor, an integrated circuit IC or the like, and cooling elements for dissipating the heat energy from the heat generating component. Most contemporary heat sinks are mounted on the cases of the heat generating components for dissipating heat generated therefrom. Some heat sinks are designed in the form of a cap structure having cooling fins that attach to and fit over one or more heat generating components. Examples of contemporary heat sink designs are disclosed in U.S. Pat. No. 4,344,106 for Transistor Heat Sink Assembly issued to West et al., U.S. Pat. No. 5,373,099 for Fixing Device For Fixing Electronic Component Against A Wall Of A Heat Sink issued to Boitard et al., U.S. Pat. No. 5,436,798 for Spring Clip And Heat Sink Assembly For Electronic Components issued to Weiland, Jr., U.S. Pat. No. 5,381,041 for Self Clamping Heat Sink issued to Harmon, U.S. Pat. No. 5,450,284 for Heat Sink And Transistor Retaining Assembly issued to Wekell, U.S. Pat. No. 5,470,795 for Method Of Connecting Terminals Of A Plastic-Encapsulated Power Transistor To A Printed Circuit Board issued to Shushurin, U.S. Pat. No. 5,500,556 for Packaging Structure For Microwave Circuit issued to Kosugi, U.S. Pat. No. 5,521,439 for Combination And Method For Coupling A Heat Sink To A Semiconductor Device issued to Casati et al., U.S. Pat. No. 5,581,442 for Spring Clip For Clamping A Heat Sink Module To An Electronic Module issued to Morosas, U.S. Patent No. 5,611,393 for Clamping Heat Sink issued to Vasconcelos et al., and U.S. Pat. No. 5,615,735 for Heat Sink Spring Device issued to Yoskida et al.

Generally, if the heat sink assembly is too small, an excessive temperature rise cannot be sufficiently dissipated. As a result, the heat generating component mounted on the printed circuit board (PCB) may be subjected to malfunctions. On the other hand, if the size of the heat sink assembly is too large, not only the manufacturing cost will be increased, but also the impact when the electronic device is dropped. As a result, the printed circuit board may be damaged. In addition, the physical space for installing other electrical components on the printed circuit board (PCB) is unnecessarily extended at the expense of the electronic device. Moreover, installation of the typical heat sink assembly can be difficult.

SUMMARY OF THE INVENTION

Accordingly, it is therefore an object of the present invention to provide an improved heat sink assembly for application to an electrical component mounted on a printed circuit board of an electronic device.

It is also an object to provide a heat sink assembly for application to an electrical component which is simple in construction, inexpensive to manufacture, easy to use, and efficient and effective in dissipating heat from the electrical component.

It is further an object to provide a heat sink assembly having a base with opposite support members extended vertically from a printed circuit board and a relatively large contact surface in contact with at least one heat generating component mounted on the printed circuit board for efficiently conducting heat through an opposite heat radiating surface to a plurality of cooling fins for heat dissipation.

These and other objects can be achieved by a heat sink assembly constructed according to the principles of the present invention and adapted to mount on a printed circuit board for dissipating heat from a heat generating component of an electronic device. The heat sink assembly includes a base extended upwardly from the printed circuit board, and having a heat conducting surface for conducting heat, and a heat radiating surface opposite of said heat conducting surface for radiating heat from the heat conducting surface; at least one heat generating component positioned in contact with the heat conducting surface of the base; a fastening clip for clamping the heat generating component in contact with the heat conducting surface of the base; a plurality of cooling fins extended from the heat radiating surface of the base at predetermined intervals for dissipating the heat conducted through the heat conducting surface of the base and generated from the heat generating component; and support members extended at opposite ends of the base for protecting the heat generating component and supporting the mounting of said heat sink assembly on the printed circuit board.

As contemplated by the present invention, the base has perforated openings adapted to permit the fastening clip to affix the heat generating component to the heat conducting surface of the base for heat conduction. The fastening clip has enlarged ends arranged to fit in respective perforated openings of the base, and a middle portion centrally pushed against the heat generating component against the base, when said fastening clip is pushed with the enlarged ends bent inwardly so as to engage the perforated openings of the base and to secure the heat generating component against the heat conducting surface of the base. In addition, an elastomeric member disposed between the heat generating component and the heat conducting surface of the base for maximizing a heat transfer rate from the heat generating component to the heat conducting surface of the base. Mounting legs are separately mountable on the printed circuit board for enabling said support members to be secured on the printed circuit board, with each mounting leg having a forked bottom portion with a plurality of downwardly extending tines that are adapted to be inserted into apertures formed in the printed circuit board, when the mounting legs are pushed into engagement with the printed circuit board.

The distance between the heat sink and the printed circuit board should be preferably 3 to 5 mm. When the heat sink has a width 5 times larger than that of the heat generating component, the base should preferably have a thickness of 1.0 to 1.5 mm. When the heat sink has a width 7 times larger than that of the heat generating component, the base should preferably have a thickness of 1.5 to 3.0 mm. Meanwhile, the cooling fins should preferably have a thickness of 0.5 to 1.0 mm, and the fins should preferably have a pitch of 5 to 8 mm.

The present invention is more specifically described in the following paragraphs by reference to the drawings attached only by way of example.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
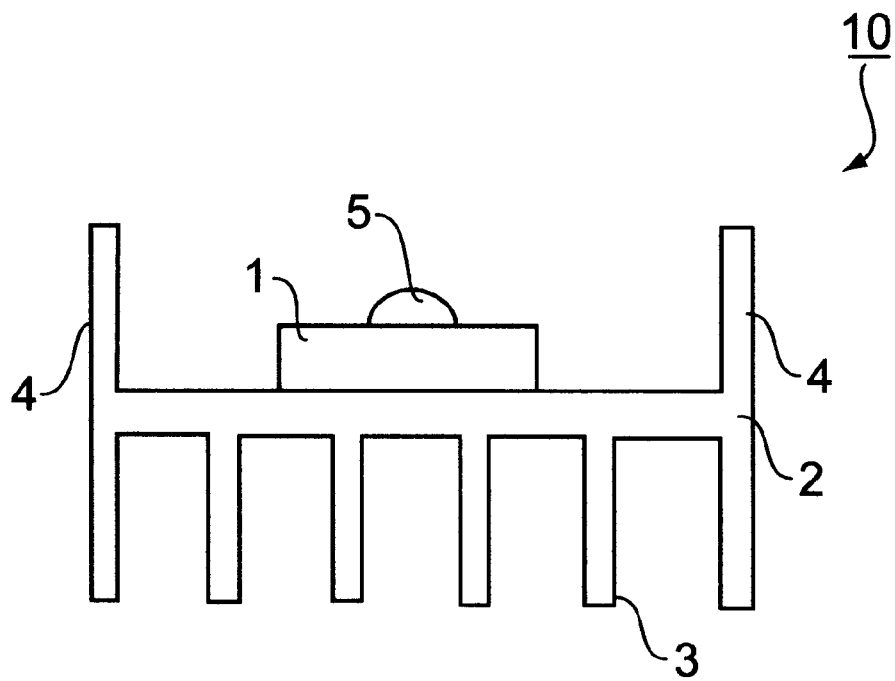
FIG. 1 is a schematic plan view of a heat sink assembly.

Referring now to the drawings and particularly to FIG. 1, which illustrates a typical heat sink assembly for application to an electrical component such as a transistor or an integrated circuit (IC) mounted on a printed circuit board (PCB) of an electronic device. The heat sink assembly includes a base with a heat conducting surface in contact with a heat generating component such as a transistor TR, an integrated circuit IC or the like by means of a fixing means such as a screw or the like. Support members are extended from base in opposite ends to protect the heat generating component. A plurality of cooling fins extended from a heat radiating surface opposite of the heat conducting surface of the base at certain intervals to dissipate the heat generated from the heat generating component.

I have observed however, that if such a heat sink assembly is too small, an excessive temperature rise cannot be sufficiently dissipated. As a result, the heat generating component mounted on the printed circuit board (PCB) may be subjected to malfunctions. On the other hand, if the size of the heat sink assembly is too large, not only the manufacturing cost will be increased, but also the impact when the electronic device is dropped. As a result, the printed circuit board may be damaged. In addition, the physical space for installing other electrical components on the printed circuit board (PCB) is unnecessarily extended at the expense of the electronic device. Moreover, installation of the typical heat sink assembly can be difficult.

Figure 2:
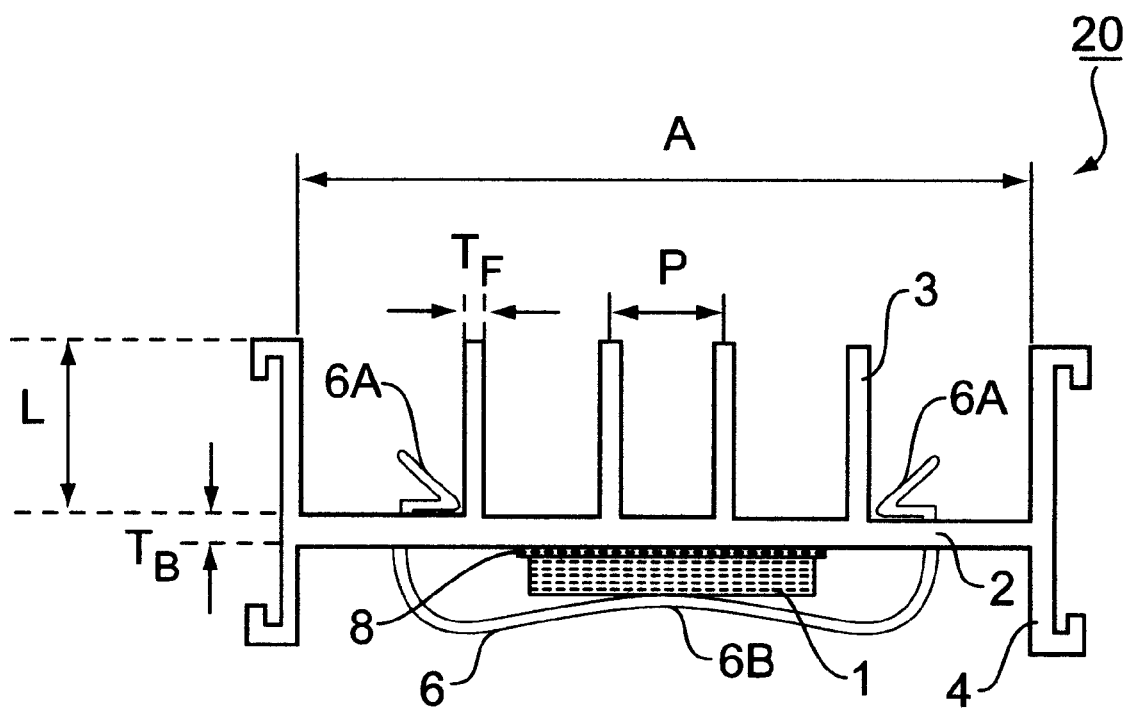
FIG. 2 is a schematic perspective view of a heat sink assembly constructed according to a preferred embodiment of the present invention.

Turning now to FIG. 2 which illustrates a plan view of a heat sink assembly 20 constructed according to a first embodiment of the present invention. The heat sink assembly 20 includes a base 2 with a heat conducting surface in contact with a heat generating component I such as a transistor TR, an integrated circuit IC or the like via an elastomeric member 8. Support members 4 are extended from base 2 in opposite ends to protect the heat generating component 1. A plurality of cooling fins 3 extended from a heat radiating surface opposite of the heat conducting surface of the base 2 at certain intervals (i.e., pitch) to dissipate the heat generated from the heat generating component 1 and thereby maintaining the temperature inside the electronic device at a desirable level in order to prevent the heat generating component 1 from malfunctions and damages due to an extended period of temperature override.

The heat conducting surface of the base 2 has two perforated openings 12 which are used to permit a fastening clip 6 to affix the heat generating component 1 to the heat conducting surface of base 2 through an elastomeric member 8 for heat conduction. The fastening clip 6, which may be a shaped strip of spring steel, has its enlarged ends 6A arranged to fit in respective perforated openings 12 of appropriate shape of the base 2, and its middle portion 6B centrally pushed against the heat generating component 1 against the base 2.

The elastomeric member 8 is disposed between the heat generating component 1 and the base 2 to improve the thermal conduction between the heat generating component 1 and the base 2, and to increase and maximize the heat transfer rate from the heat generating component 1 to the base 2. This is because most contemporary heat sinks fail to sufficiently maximize the heat transfer rate from the heat generating component 1 to the base 2 due to the unevenness of the contact surface between the heat generating component 1 and the base 2, even when the heat generating component 1 is pushed in contact with the base 2.

Figure 3:
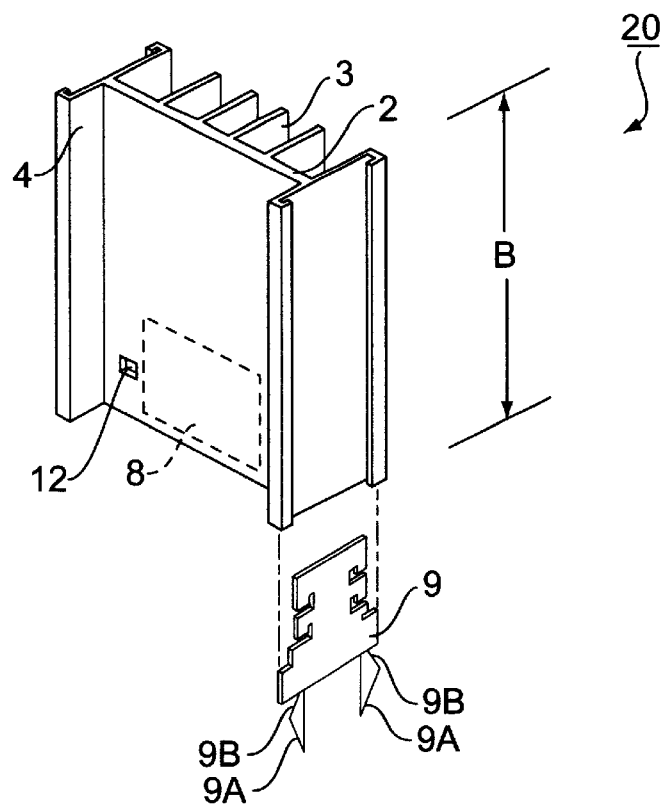
FIG. 3 is a plan view of the heat sink assembly as shown in FIG. 2.

FIG. 3 is a perspective view of the heat sink assembly of FIG. 2. Mounting legs 9 are separately mounted on a printed circuit board (PCB) so that the support members 4 of the heat sink assembly 20 can be secured on the printed circuit board (PCB). The support members 4 each has extended grips along its lateral length for forming a guide rail to accommodate the mounting legs 9. The mounting legs 9 each has a forked bottom portion with two downwardly extending tines 9A that are adapted to be inserted into apertures formed in the printed circuit board (PCB) so as to retain the heat sink assembly 20 on the printed circuit board (PCB). The tines 9A each has notches 9B formed therein to receive the printed circuit board (PCB) around the aperture (not shown) to lock the tines 9A in their respective apertures when the mounting legs 9 are pushed into engagement with the printed circuit board (PCB). As such, the mounting legs support the heat sink assembly 20 substantially perpendicular to the printed circuit board (PCB), with the heat generating component 1 positioned over lead apertures in the printed circuit board (PCB). The mounting legs 9 provide support for the heat sink assembly 20, in part because they are oriented perpendicular to the heat generating component 1 so the mounting legs 9 extend in different direction and provide stability to the heat sink assembly 20 when the heat sink assembly 20 is mounted onto the printed circuit board (PCB). Alternatively, each mounting leg 9 may be constructed with only one downwardly extending tine as long as the single tine is sufficient to secure the heat sink assembly 20 on the printed circuit board (PCB).

Figure 4:
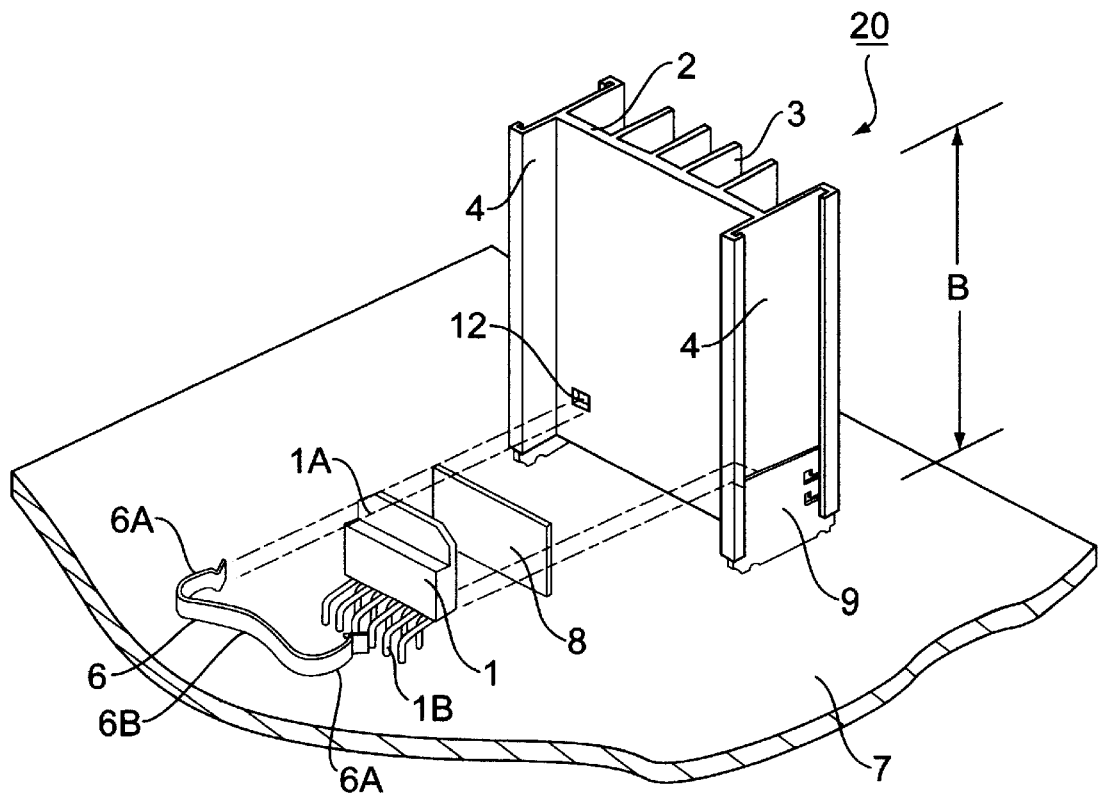
FIG. 4 is an exploded perspective view of the heat sink assembly as shown in FIG. 2.

FIG. 4 illustrates coupling relationships of the heat sink assembly 20 mounted on the printed circuit board (PCB) 7, when the fastening clip 6 is pushed with its ends 6A bent inwardly so as to engage the perforated openings 12 and secure the heat generating component 1 and the elastomeric member 8 against the conducting surface of base 2. This way the heat sink can be easily assembled and dissembled from the printed circuit board (PCB) 7.

As shown in FIG. 2 to FIG. 4, the heat sink assembly 20 typically has a width (A) five times larger than the width of the heat generating component 1. The depth (B) of the heat sink assembly 20 is generally fixed. The base 2 should preferably have a thickness ($T_B$) of 1.0 to 1.5 mm. In the case where the heat sink assembly 20 has a width (A) seven times larger than that of the heat generating component 1, the base 2 should preferably have a thickness ($T_B$) of 1.5 to 3.0 mm. Meanwhile, the cooling fins 3 each should preferably have a thickness ($T_F$) of 0.5 to 1.0 mm, but its length (L) may be varied. Each pitch (P) between adjacent cooling fins 3 should preferably be from 5 to 8 mm. If an air layer is formed between the heat generating component 1 and the base 2, then the heat transfer rate may be decreased. Therefore, an elastomeric member 8 should be preferably inserted between the heat generating component 1 and the base 2, so that heat may be efficiently transferred from the heat generating component 1 to the base 2. The elastomeric member 8 should be preferably made of rubber which has a high heat resistance and a high thermal conductivity.

Figure 5:
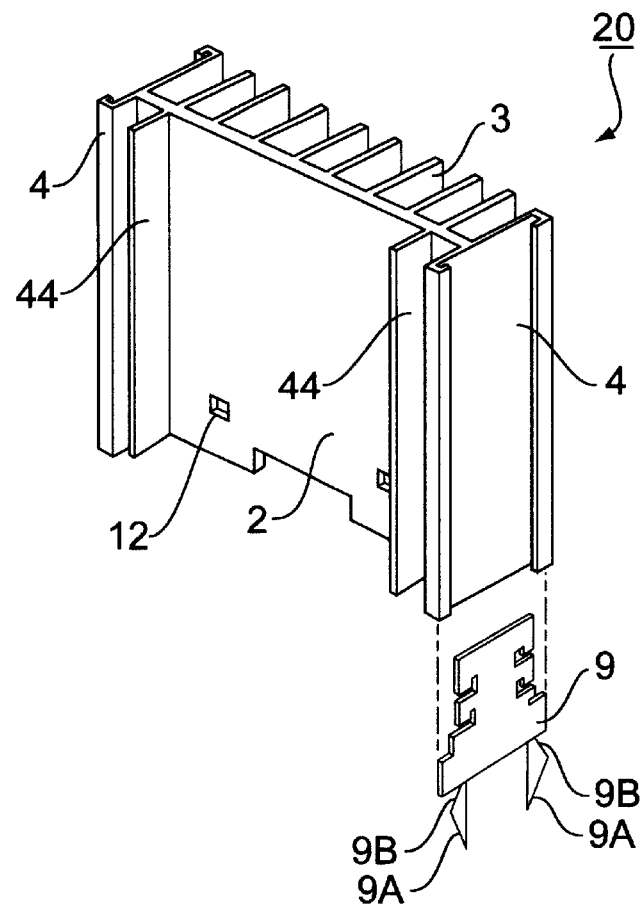
FIG. 5 is a schematic perspective view of a heat sink assembly constructed according to a second embodiment of the present invention.

FIG. 5 illustrates a heat sink assembly constructed according to a second embodiment of the present invention. The second embodiment is similar to the first embodiment except for the addition of protective members 44 which are formed to protect the heat generating component 1 from damages due to impact. In this embodiment, the width (A) of the heat sink assembly 20 is slightly wider than the first embodiment.

Figure 6:
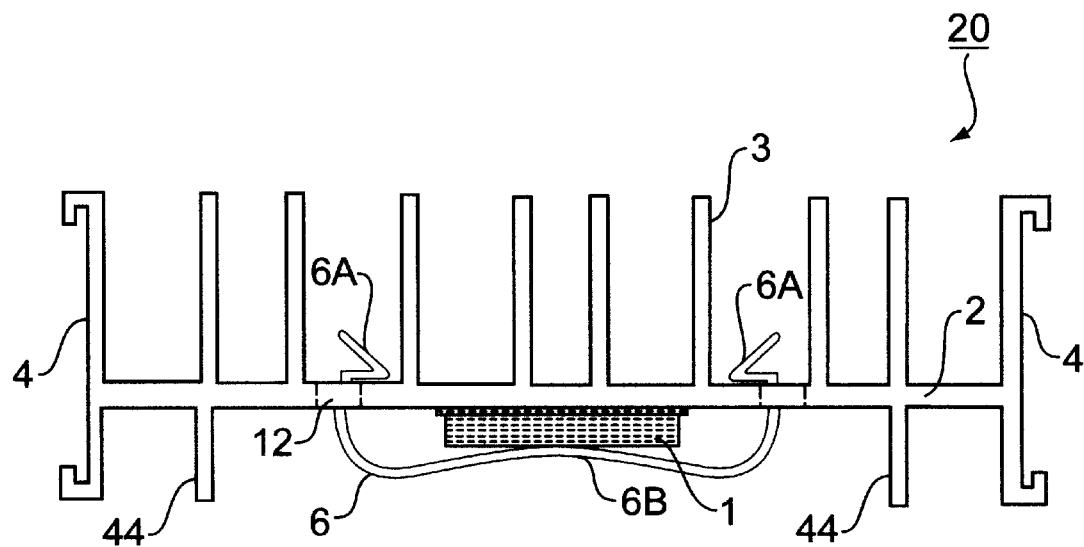
FIG. 6 is a schematic plan view of the heat sink assembly as shown in FIG. 5.
Figure 7:
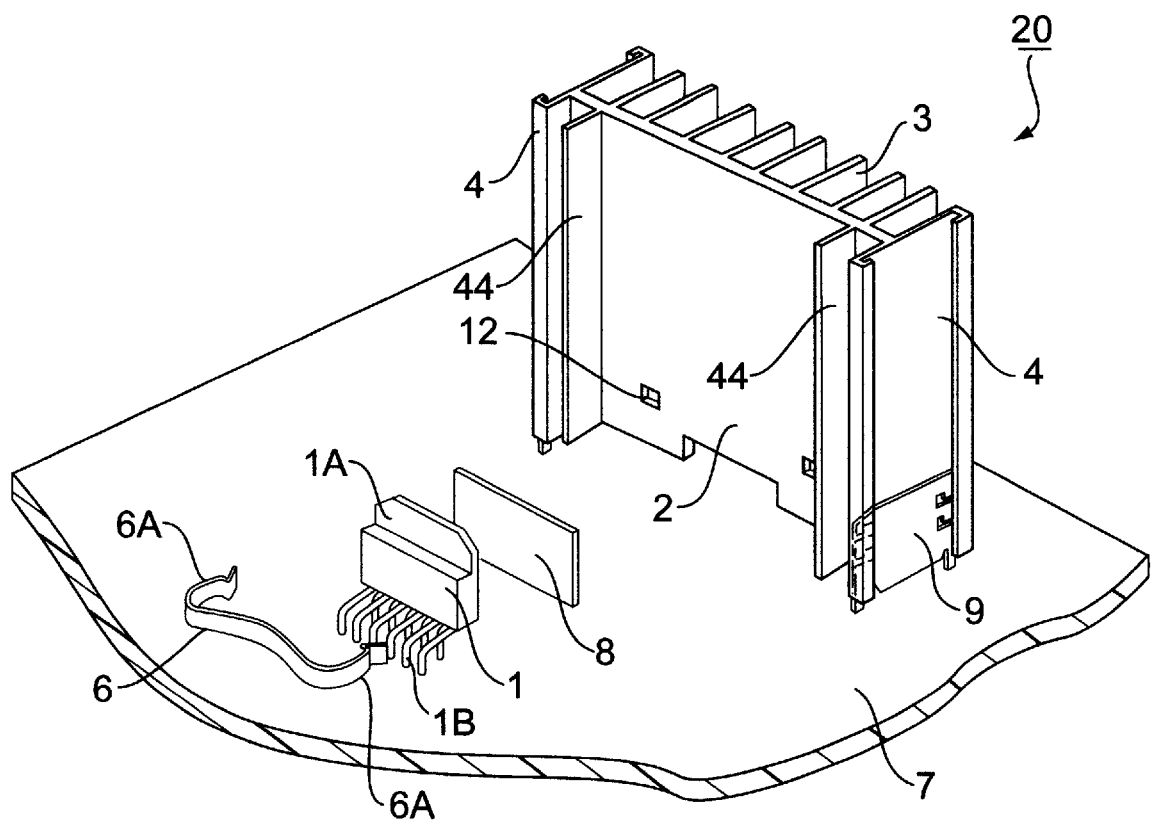
FIG. 7 is a perspective view of the heat sink as shown in FIG. 5.
Figure 8:
FIG. 8 is a graphical illustration of cooling efficiency of the heat sink assembly relative to variation of the thickness of the base, when the width of the heat sink is substantially the same as the width of the heat generating component mounted on a printed circuit board.
Figure 9:
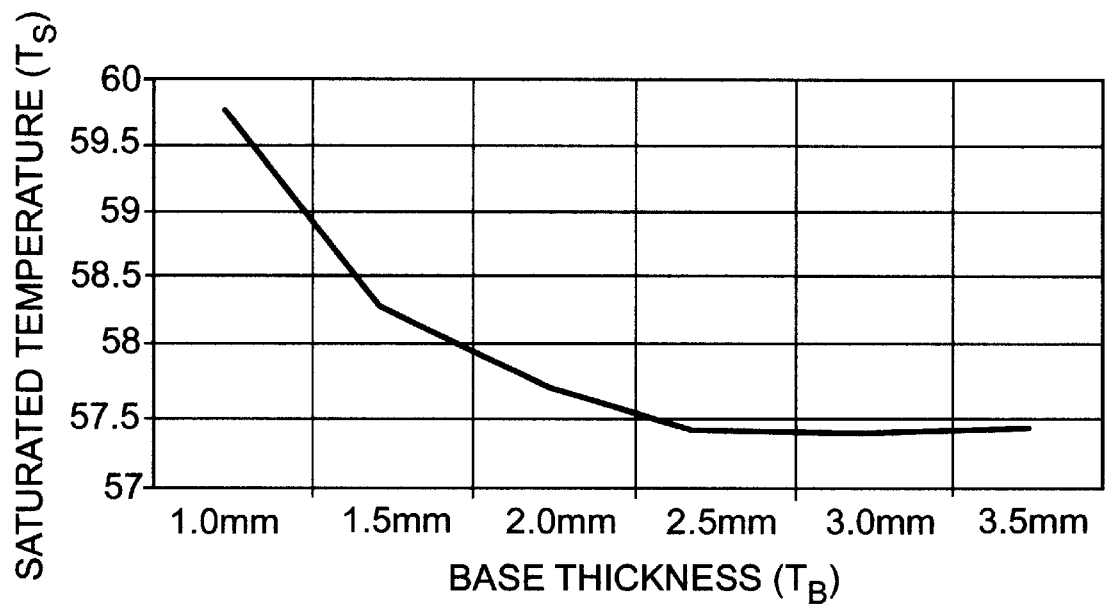
FIG. 9 is a graphical illustration of cooling efficiency of the heat sink assembly relative to variation of the thickness of the base, when the width of the heat sink is larger than the width of the heat generating component mounted on a printed circuit board.
Figure 10:
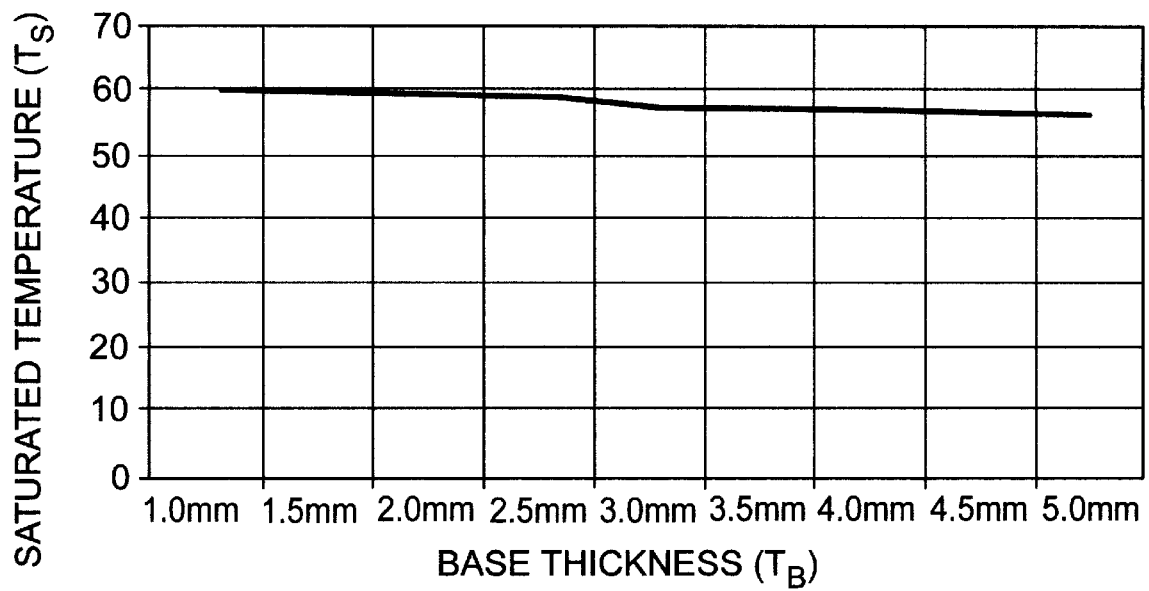
FIG. 10 is a graphical illustration of cooling efficiency of the heat sink assembly relative to variation of the thickness of the base, when all cooling fins exhibit the same length.
Figure 11:
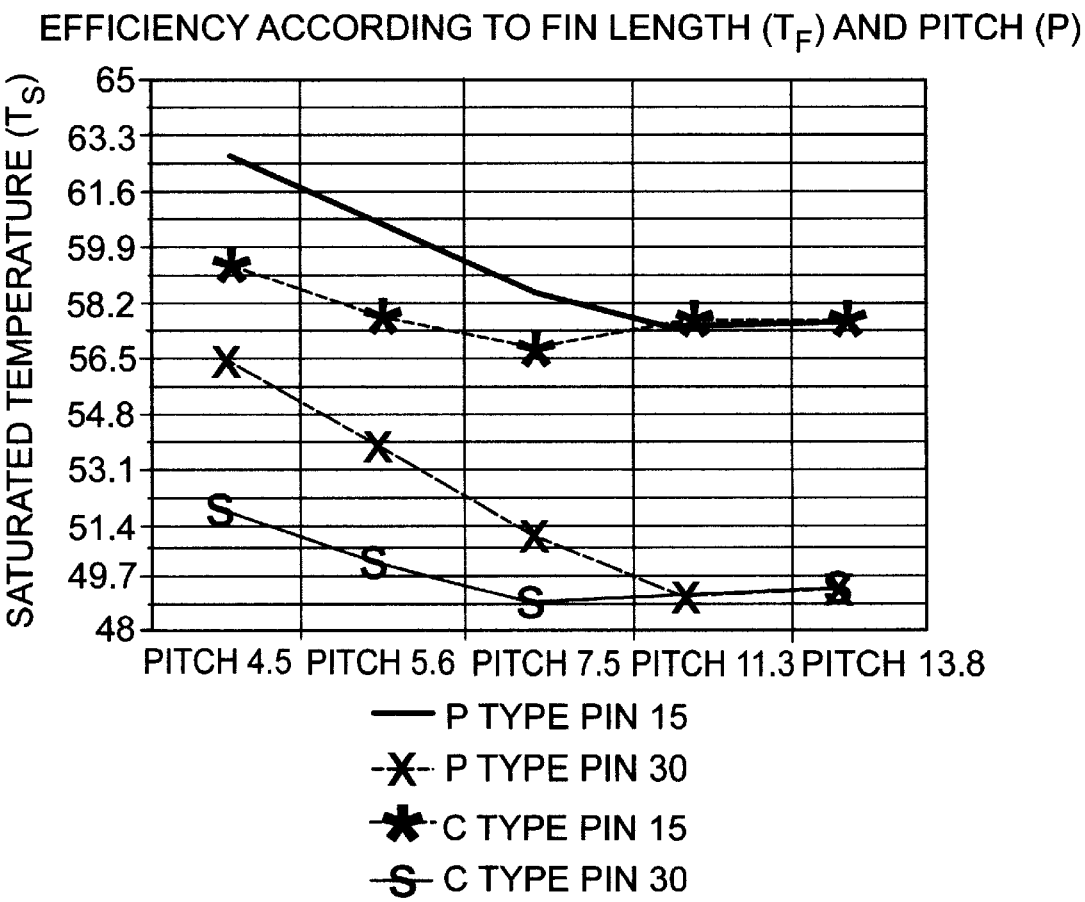
FIG. 11 is a graphical illustration of cooling efficiency of the heat sink assembly relative to variation of the height of the cooling fins and the biasing of the cooling fins relative to the center of the base.

Likewise, FIG. 6 illustrates in a plan view of the heat sink assembly 20 as shown in FIG. 5, with the heat generating component 1 pushed in contact with the heat conduction surface of base 2 by the fastening clip 6. Similarly, FIG. 7 illustrates the coupling relationships of the heat sink assembly 20 mounted on the printed circuit board (PCB) 7, when the fastening clip 6 is pushed with its ends 6A bent inwardly so as to engage the perforated openings 12 and secure the heat generating component 1 and the elastomeric member 8 against the conducting surface of base 2 between adjacent protective members 44.

Now, the operation and efficiency of the heat dissipation of the heat sink assembly 20 constructed according to the principles of the present invention will be described in detail with reference to FIGS. 8 to 11 hereinbelow.

First, FIGS. 8 to 11 illustrate the heat dissipation efficiency versus the variations of various dimensions and conditions of the heat sink assembly 20. During experiments of the novel heat sink assembly 20 of the present invention, the heat dissipation efficiency was decided based on the maximum temperature of the heat generating component 1 in the normal state. If the maximum temperature of the heat generating component 1 is low, the heat dissipation efficiency is inversely high. Likewise, if the maximum temperature is high, the heat dissipation efficiency is inversely low. In all experiments, separate cooling device such as a fan or the like was not used, but it was left to the natural convection of the assembly.

In the first experiment, the measurements were carried out for a heat sink with the same shape and conditions but with different materials. One was a planar heat sink (A1050) made of pure aluminum, and another was an extruded heat sink (A6063) made of aluminum with impurities is contained therein. The ambient temperature was 20° C., and the power consumption of the heat generating component was 2.5 W.

TABLE 1

| Heat Sink Type | Maximum Temperature | Temperature Deviation |
| --- | --- | --- |
| A1050 | 60.481° C. | 0 |
| A6063 | 60.665° C. | +0.184 |

Table 1 shows the results of the comparison of the heat dissipation efficiency of two different types of heat sinks. It is seen that the variation of the heat dissipation efficiency versus the variation of the material is negligible. This suggests that the heat transfer is promoted much more by convection rather than conduction.

In the second experiment, the heat dissipation efficiency was measured with a heat sink assembly 20 having a width A of 23 mm, a depth B of a fixed length, and a length (L) of the cooling fins varied from 7.5 mm to 9.5 mm. The ambient temperature was 20° C., and the power consumption of the heat generating component was 2.5 W. The results of the measurements are shown in Table 2 and in FIG. 8. The width (W) of the heat sink was about 3–5 times larger than that of the heat generating component 1.

TABLE 2

| Thickness ($T_B$) | Max. temperature (° C.) | Deviation | Fin length (L) |
| --- | --- | --- | --- |
| 1.0 mm | 60.110 | 0 | 9.5 mm |
| 1.5 mm | 60.673 | 0.563 | 9.0 mm |
| 2.0 mm | 61.006 | 0.896 | 8.5 mm |
| 2.5 mm | 61.446 | 1.336 | 8.0 mm |
| 3.0 mm | 61.938 | 1.828 | 7.5 mm |

As can be seen in Table 2, the smaller the thickness ($T_B$) of the base 2, the lower the maximum temperature (Ts). Therefore, if the depth (B) of the heat sink is fixed, the thinner the thickness ($T_B$) of the base 2, the higher the heat dissipation efficiency. That is, as the thickness ($T_B$) of the base 2 is reduced, so much the radiating area of the cooling fins is increased. Therefore, the thinner the thickness ($T_B$) of the base 2, the more the heat dissipation efficiency is improved.

In the third experiment, the width (A) of the heat sink was fixed to 70 mm, and the depth (B) of the heat sink was made constant. Then measurements were carried out while varying the thickness ($T_B$) of the base 2. The results are shown in Table 3 and FIG. 9. The ambient temperature was 20° C., and the power consumption of the heat generating component was 2.5 W, while the width (A) of the heat sink was 8 times larger than that of the heat generating component 1.

TABLE 3

| Base Thickness ($T_B$) | Maximum Temperature (° C.) | Deviation (° C.) |
| --- | --- | --- |
| 1.0 mm | 59.707 | 0 |
| 1.5 mm | 58.333 | −1.374 |
| 2.0 mm | 57.724 | −1.983 |
| 2.5 mm | 57.409 | −2.298 |
| 3.0 mm | 57.351 | −2.356 |
| 3.5 mm | 57.426 | 2.281 |

As can be seen in Table 3, when the thickness ($T_B$) of the base 2 is 3.0 mm, the heat dissipation efficiency is highest.

In the fourth experiment, the length of the cooling fins was maintained constant, and the heat dissipation efficiency was measured while varying the thickness ($T_B$) of the base 2. The results are shown in Table 4 and FIG. 10. The ambient temperature was 20° C., and the power consumption of the heat generating component 1 was 2.5 W.

TABLE 4

| Base Thickness ($T_B$) | Maximum Temperature (° C.) | Remarks |
| --- | --- | --- |
| 1.0 mm | 60.110 | |
| 1.5 mm | 59.994 | |
| 2.0 mm | 59.305 | |
| 2.5 mm | 59.165 | |
| 3.0 mm | 57.644 | |
| 4.0 mm | 57.140 | |
| 5.0 mm | 56.650 | |

After an analysis of the experiments, the following facts were found. That is, if the length (L) of the cooling fins 3 is maintained constant, and if the thickness ($T_B$) of the base 2 is increased, it is equivalent to an increase of the size of the heat sink. Therefore, the thicker the thickness ($T_B$) of the base 2, the greater the heat transfer is increased.

Upon a comprehensive consideration, if the width (A) of the heat sink is 3–5 times larger than that of the heat generating component 1, the thickness of the base 2should be preferably 1.0–1.5 mm. If the width of the heat sink is seven (7) times larger than that of the heat generating component 1, the thickness of the base 2 should be preferably 1.5–3.0 mm.

In the fifth experiment, the size and shape of the heat sink were maintained in the same state, and only the thickness of the cooling fins 3 was varied. The ambient temperature was 20° C., and the power consumption of the heat generating component was 2.5 W. The measured values are shown in Table 5 below.

TABLE 5

| Thickness of Cooling Fins ($T_F$) | Maximum Temperature (° C.) |
| --- | --- |
| 1.0 mm | 60.927 |
| 0.9 mm | 59.562 |
| 0.8 mm | 59.391 |
| 0.7 mm | 59.240 |
| 0.6 mm | 59.115 |
| 0.5 mm | 58.989 |
| 0.1 mm | 59.353 |

The experiment indicates that the optimum thickness ($T_F$) of the cooling fins is 0.5 mm. However, in actuality, the consideration of the workability model shows that the thickness ($T_F$) of the cooling fins should be preferably 0.8 to 1.0 mm.

In the sixth experiment, the heat dissipation efficiencies were compared between a C type heat sink and a P type heat sink. In the C type heat sink, four cooling fins 3 were formed at the middle portion of the base 2. In the P type heat sink, four cooling fins were biasedly formed on the base 2. The widths (A) of the two heat sinks were made constant at 70 mm, and measurements were carried out by varying the length (L) of the cooling fins to 15 mm and 30 mm. Then the measured results are shown in Table 6 and FIG. 11.

TABLE 6

| Pitch (mm) | No. of Fins | Maximum Temperature (° C.) | | | | Remarks |
| --- | --- | --- | --- | --- | --- | --- |
| | | Biased Pitch | | Center Pitch | | |
| | | 15 mm | 30 mm | 15 mm | 30 mm | |
| 4.5 | 4 | 62.610 | 56.354 | 59.223 | 51.783 | |
| 5.6 | 4 | 60.402 | 53.744 | 57.675 | 50.113 | |
| 7.5 | 4 | 58.467 | 50.911 | 56.739 | 48.854 | |
| 11.3 | 4 | 57.379 | 49.222 | 57.598 | 49.211 | |
| 13.8 | 4 | 57.721 | 49.524 | 57.721 | 49.524 | Even Pitch |

As can be seen above, the cooling fins 3 should be preferably formed concentratively on the base 2, and the pitch (P) of the cooling fins should be preferably 5 to 8 mm.

In the seventh experiment, the heat dissipation efficiencies were measured while varying the height and width of a heat sink, with its shape being fixed. The heat sink was made of A6063, the ambient temperature was 20° C., the thickness ($T_B$) of the base was 2 mm, and the thickness ($T_F$) of the cooling fins was 1.0 mm.

TABLE 7

| Heat Dissipation Efficiency (Same Section Profile) | | Heat Dissipation Efficiency at Different Conditions (with fixed height, and fixed fin height) | | | | Heat Dissipation Efficiency at Different Widths (with fixed height and fixed fin height) | | | |
|---|---|---|---|---|---|---|---|---|---|
| Height | Saturated Temperature (Ts) | Width | No. of fins | Pitch | Saturated Temperature (Ts) | Width | No. of fins | Pitch | Saturated Temperature (Ts) |
| 35 | 75.851° C. | 23.50 | 6 | 4.30 | 75.851° C. | 23.50 | 6 | 4.30 | 75.851° C. |
| 40 | 73.598° C. | 32.85 | 6 | 6.57 | 94.895° C. | 32.85 | 6 | 6.57 | 64.895° C. |
| 45 | 71.704° C. | 42.20 | 6 | 8.44 | 60.967° C. | 36.95 | 7 | 6.15 | 62.019° C. |
| 50 | 70.178° C. | 51.57 | 6 | 10.31 | 58.298° C. | 46.32 | 7 | 7.72 | 58.544° C. |
| 55 | 68.930° C. | 60.93 | 6 | 12.19 | 56.146° C. | 59.79 | 8 | 7.20 | 56.586° C. |
| 60 | 67.904° C. | 70.29 | 6 | 14.06 | 54.113° C. | 59.79 | 8 | 8.54 | 54.616° C. |
| 65 | 67.050° C. | 79.65 | 6 | 15.93 | 52.725° C. | 63.90 | 9 | 7.99 | 53.022° C. |
| 70 | 66.333° C. | 89.00 | 6 | 17.80 | 51.344° C. | 68.00 | 10 | 7.50 | 51.691° C. |
| 75 | 65.732° C. | 98.35 | 6 | 19.67 | 20.135° C. | 72.10 | 11 | 7.21 | 51.059° C. |
| 80 | 65.223° C. | 107.70 | 6 | 21.54 | 49.068° C. | 76.20 | 12 | 6.92 | 49.706° C. |

As can be seen from Table 7, with a heat sink of same shape, the higher the height of the heat sink, the greater the heat dissipation efficiency. With the heat sink of same weight, the width (W) should be preferably increased rather than the height. It can be seen that the heat sensitivity of the width of the heat sink is higher than the heat sensitivity of the length.

In the eighth experiment, the heat dissipation efficiencies were measured with a heat sink of the same shape, but with the fastening position of the heat generating component being varied. The results are shown in Table 8 below. The heat sink was made of A6063, the ambient temperature was 20° C., the power consumption of the heat generating component was 2.5 W, the thickness ($T_B$) of the base was 2 mm, and the thickness ($T_F$) of the cooling fins was 1.0 mm.

TABLE 8

| Position | Max. Temperature (° C.) | Deviation | Remarks |
|---|---|---|---|
| Center | 60.690 | 0 | |
| +2 mm | 60.683 | −0.007 | Upper portion of heat sink |
| +5 mm | 60.598 | −0.092 | Upper portion of heat sink |
| +7 mm | 60.689 | −0.001 | Upper portion of heat sink |
| +10 mm | 60.714 | +0.024 | Top of heat sink |
| −5 mm | 60.905 | +0.215 | Lower portion of heat sink |
| −10 mm | 61.190 | +0.500 | Bottom of heat sink |

As can be seen from Table 8, the heat generating component 1 should be preferably fastened slightly above the middle of the heat sink. Under this condition, however, the improvement of the heat dissipating efficiency is negligible. When the heat sink is installed on the printed circuit board (PCB), the heat sink should be preferably installed separated from the printed circuit board (PCB) by 3 to 5 mm, so that air may flow through the gap to improve the heat dissipation efficiency.

The above results can be summed up as follows. For a heat sink having a width (W) of 44 mm, it is desirable to provide a base thickness ($T_B$) of 1.8 mm, a fin thickness ($T_F$) of 0.8 to 1.0 mm (1.0 mm is desirable if considering the extrusion), and a number of fins of 4. For a heat sink having a width (W) of 72 mm, it is preferable to provide a base thickness ($T_B$) of 1.8 mm, a fin thickness ($T_F$) of 0.8 to 1.0 mm, and a number of fins of 8. For both of the heat sinks, the bottom of the heat sink is installed separated from the printed circuit board (PCB) by 3 to 5 mm. As described by the present invention, high heat dissipation efficiency is obtained by making the heat sink closely contacted to the heat generating component.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. A heat sink assembly adapted to mount on a printed circuit board, comprising:

a base extended upwardly from any printed circuit board supporting said base, and having a heat conducting surface providing a central web exhibiting continuous dimensions of length and width perforated by a plurality of apertures, and a heat radiating surface on an opposite side of said base;

a clip having a central bow terminating at opposite ends by oppositely directed tabs each insertable through a different one of said apertures to engage said heat radiating surface while said bow extends across said width of said web and clamps said heat conducting surface of said base against a heat generating component mounted on any circuit board;

a plurality of cooling fins extended from said heat radiating surface of said base at predetermined intervals; and a plurality of support members each bearing a plurality of downwardly extending tines insertable into corresponding apertures formed in any circuit board, each of said support members extending along opposite ends of said base and combining with said base to partially enclose a heat generating component while supporting a mounting of said heat sink assembly on and in a spaced-apart relation from any printed circuit board supporting said base.

2. The heat sink assembly of claim 1, further comprised of said bow centrally urging a heat generating component against said base while said opposite ends extend inwardly through corresponding said plurality of apertures and releasably engage said heat radiating surface of said base.

3. The heat sink assembly of claim 1, further comprising an elastomeric member disposed between a heat generating component and said heat conducting surface of said base providing heat transfer from a heat generating component to said heat conducting surface of said base.

4. The heat sink assembly of claim 1, with each of said support members comprising a fringe forming opposite facing channels, and a mounting legs slidably insertable between a pair of said opposite facing channels.

5. The heat sink assembly of claim 1, with said support members comprised of a mounting leg each having at a first end terminated by a corresponding one of said times and a second end exhibiting a width, said support members each fiber comprised of a plurality of extended channels forming guide rails to accommodate slidable insertion of a corresponding said width of a respective said second end.

6. The heat sink assembly of claim 5, further comprised of each said mount leg having an enlargement positioned between said tine and said second end, with each said enlargement exhibiting a linear dimension that is parallel to and greater than said width of said second end and that maintains said base separated from any printed circuit board supporting said base.

7. The heat sink assembly of claim 1, further comprised of said base exhibiting a thickness of 1.0 to 1.5 mm and said having a height five times higher than any heat generating component embraced by said clip against said base.

8. The heat sink assembly of claim 1, further comprised of said base exhibiting a thickness of 1.5 to 3.0 mm and said base having a height seven times higher than any heat generating component embraced by said clip against said base.

9. The heat sink assembly of claim 1, further comprised of each of said cooling fins exhibiting a thickness of between 0.5 to 1.0 mm.

10. The heat sink assembly of claim 1, further comprised of said cooling fins being separated by an interval of between 5 to 8 mm.

11. A heat sink assembly adapted to mounted on a printed circuit board, said heat sink assembly comprising:

a base extended upwardly from a printed circuit board supporting said base, and having a heat conducting surface providing a central web exhibiting continuous dimensions of length and width and being perforated on opposite sides of said web by a plurality of apertures, and a heat radiating surface on an opposite side of said heat conducting surface;

a plurality of spaced-apart cooling fins extended from the heat radiating surface of said base at intervals;

a plurality of protective members separated by said width and extending transversely from opposite edges of said base; and a plurality of supportive members each bearing a plurality of downwardly extending tines insertable into corresponding apertures formed in the circuit board, each of said supportive members extended at opposite en of said base while engaging said protective members and maintaining a fixed separation between said base and any circuit board supporting said base.

12. The heat sink assembly of claim 11, further comprised of a clip having an intermediate bow separating distal ends each bent to pass through corresponding ones of said apertures and embrace a heat radiating surface while said bow spans said web.

13. The heat sink assembly of claim 11, further comprised of a clip having enlarged ends fitting through corresponding said apertures in said base, and a middle bow separating said enlarged ends.

14. The heat sink assembly of claim 11, further comprising an elastomeric member positioned on said heat conducting surface of said base, between said heat conducting surface and any heat generating component positioned between said opposite edges.

15. The heat sink assembly of claim 11 further comprising each of said protective members bearing flanges forming opposite facing channels, and each of said supportive members being slidably insertable between pairs of said opposite facing channels and being separately mountable on any printed circuit board supporting said base.

16. The heat sink assembly of claim 11, further comprised of said supportive members maintaining said base separated from any printed circuit board supporting said base by approximately 3 to 5 mm.

17. The heat sink assembly of claim 11, further comprised of said base exhibiting a thickness of 1.0 to 1.5 mm, when said heat sink assembly has a height five times higher than that of any heat generating component positioned between said opposite edges.

18. The heat sink assembly of claim 11, further comprised of said base exhibiting a thickness of 1.5 to 3.0 mm, when said heat sink assembly has a height seven times higher than that of a heat generating component positioned between said opposite edges, each of said cooling fins exhibiting a thickness of 0.5 to 1.0 mm, and said cooling fins being separated by an interval of between 5 to 8 mm.

* * * * *